United States Patent
Ueno

(10) Patent No.: US 10,903,192 B2
(45) Date of Patent: Jan. 26, 2021

(54) VEHICLE LUMINAIRE AND VEHICLE LAMP

(71) Applicant: Toshiba Lighting & Technology Corporation, Yokosuka (JP)

(72) Inventor: Misaki Ueno, Yokosuka (JP)

(73) Assignee: Toshiba Lighting & Technology Corporation, Yokosuka (JP)

(*) Notice: Subject to any disclaimer, the term of this patent is extended or adjusted under 35 U.S.C. 154(b) by 129 days.

(21) Appl. No.: 16/105,007

(22) Filed: Aug. 20, 2018

(65) Prior Publication Data
US 2019/0267355 A1     Aug. 29, 2019

(30) Foreign Application Priority Data
Feb. 28, 2018   (JP) ................. 2018-035461

(51) Int. Cl.
| | | |
|---|---|---|
| H01L 25/075 | (2006.01) | |
| F21V 29/77 | (2015.01) | |
| F21V 29/87 | (2015.01) | |
| F21S 43/14 | (2018.01) | |
| F21V 17/14 | (2006.01) | |
| F21V 23/06 | (2006.01) | |
| H01L 33/48 | (2010.01) | |
| H01L 33/52 | (2010.01) | |
| H01L 33/62 | (2010.01) | |
| H01L 33/64 | (2010.01) | |
| F21S 41/19 | (2018.01) | |

(Continued)

(52) U.S. Cl.
CPC ........ *H01L 25/0753* (2013.01); *F21S 41/151* (2018.01); *F21S 41/192* (2018.01); *F21S 43/14* (2018.01); *F21V 17/14* (2013.01); *F21V 23/06* (2013.01); *F21V 29/773* (2015.01); *F21V 29/87* (2015.01); *H01L 33/486* (2013.01); *H01L 33/52* (2013.01); *H01L 33/62* (2013.01); *H01L 33/641* (2013.01); *F21S 43/30* (2018.01); *F21V 23/005* (2013.01); *F21Y 2115/10* (2016.08); *H01L 33/502* (2013.01); *H01L 33/507* (2013.01)

(58) Field of Classification Search
CPC .................... F21S 41/151; F21Y 2105/16
See application file for complete search history.

(56) References Cited

U.S. PATENT DOCUMENTS

| | | |
|---|---|---|
| 2005/0041434 A1 | 2/2005 | Yatsuda et al. |
| 2007/0041207 A1 | 2/2007 | Ishida |

(Continued)

FOREIGN PATENT DOCUMENTS

| | | |
|---|---|---|
| DE | 202006009693 U1 | 8/2006 |
| FR | 2889869 A1 | 2/2007 |

(Continued)

OTHER PUBLICATIONS

Feb. 18, 2019—(EP) Extended Search Report—App 18189355.3.

*Primary Examiner* — Diane I Lee
*Assistant Examiner* — Zachary J Snyder
(74) *Attorney, Agent, or Firm* — Banner & Witcoff, Ltd.

(57) ABSTRACT

A vehicle luminaire according to an exemplary embodiment includes: a socket; a board provided at one end of the socket; and three light-emitting elements provided on the board. A triangle formed by line segments connecting respective centers of the three light-emitting elements is scalene triangle in planar view. A center of the vehicle luminaire is included inside the scale triangle.

18 Claims, 6 Drawing Sheets

(51) Int. Cl.
*F21S 41/151* (2018.01)
*F21Y 115/10* (2016.01)
*F21S 43/30* (2018.01)
*F21V 23/00* (2015.01)
*H01L 33/50* (2010.01)

(56) References Cited

U.S. PATENT DOCUMENTS

| | | |
|---|---|---|
| 2007/0167054 A1 | 7/2007 | Wu |
| 2010/0020541 A1 | 1/2010 | Incorvia et al. |
| 2015/0016136 A1 | 1/2015 | Nakano et al. |
| 2015/0153026 A1 | 6/2015 | Chen |
| 2018/0153064 A1* | 5/2018 | Zorn ................ F21S 41/141 |
| 2019/0120457 A1* | 4/2019 | Alisafaee ............ F21S 41/663 |

FOREIGN PATENT DOCUMENTS

| | | |
|---|---|---|
| JP | 2013-247093 A | 12/2013 |
| WO | 2012/164506 A1 | 12/2012 |

* cited by examiner

| IRRADIATION REGION | PROPORTION (%) OF LUMINOUS FLUX IN VISUAL DIRECTION |
|---|---|
| A | 6% OR MORE AND LESS THAN 40% |
| B1~B4 | |
| C1~C4 | <15% |
| A+B | ≥55% |
| A+B+C | ≥90% |

# VEHICLE LUMINAIRE AND VEHICLE LAMP

CROSS-REFERENCE TO RELATED APPLICATIONS

This application is based upon and claims the benefit of priority from Japanese Patent Application No. 2018-035461, filed on Feb. 28, 2018; the entire contents of which are incorporated herein by reference.

FIELD

Exemplary embodiments described herein relate to a vehicle luminaire and a vehicle lamp.

BACKGROUND

A vehicle luminaire including a socket and a light-emitting module provided at one end of the socket and having a light-emitting diode (LED) is known.

The vehicle luminaire having a light-emitting diode is widely employed to popular vehicles such as subcompact cars and the number of vehicles mounted with such a vehicle luminaire steadily increases. With a wide spread of the vehicle luminaire having a light-emitting diode, there is a demand for miniaturization of the vehicle luminaire. For example, in relatively small vehicles such as standard-sized cars or subcompact cars, it is necessary to secure a vehicular cabin space in the limited vehicle size. For this reason, there is a demand for miniaturization of a vehicle lamp and a light-emitting module.

Here, in the case of a vehicle luminaire provided in an automobile, it is preferable to set a light distribution characteristic that is almost a point of symmetry with respect to a center of an irradiation region. For this reason, generally, one light-emitting diode is provided at each of four corners of a quadrate or each of four ends of a cross.

However, in this case, spaces for providing four light-emitting diodes are necessary, and thus the light-emitting module is difficult to miniaturize.

In addition, in the case of the vehicle luminaire provided in the automobile, there is a limit to a voltage applied to the light-emitting module. For this reason, if the four light-emitting diodes are connected in series, a desired total luminous flux may not be obtainable depending on a forward voltage characteristic of the light-emitting diode.

In this case, if the number of the light-emitting diodes is set to three, an installation space can be reduced and a desired total luminous flux is easy to obtain. However, if three light-emitting diodes are provided simply, a desired light distribution characteristic is difficult to obtain.

In this regard, there is a demand for development of a technology capable of obtaining a desired light distribution characteristic even if three light-emitting diodes are provided.

DETAILED DESCRIPTION

Figure 1:
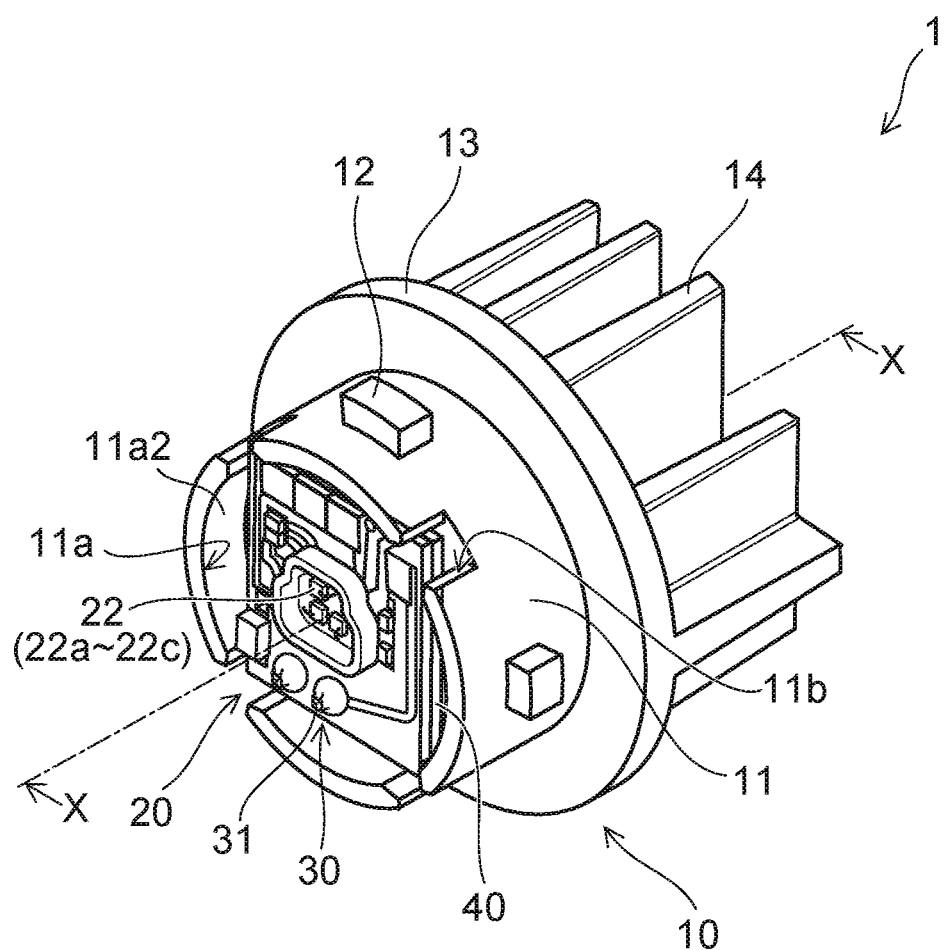
FIG. 1 is a schematic perspective view for illustrating a vehicle luminaire according to an exemplary embodiment.

A vehicle luminaire according to an exemplary embodiment includes: a socket; a board provided at one end of the socket; and three light-emitting elements provided on the board. A triangle formed by line segments connecting respective centers of the three light-emitting elements is a scalene triangle in planar view. A center of the vehicle luminaire is included inside the scalene triangle.

Hereinafter, exemplary embodiments will be described with reference to the drawings. Note that identical constituent elements are given the same reference numerals throughout the drawings, and detailed description thereof will be omitted as appropriate.

A vehicle luminaire 1 according to an exemplary embodiment can be provided, for example, in an automobile, a rail vehicle, and the like. As the vehicle luminaire 1 provided in an automobile, for example, those used in a front combination light (for example, one obtained by appropriately combining a daylight running lamp (DRL), a position lamp, a turn signal lamp, and the like), a rear combination light (for example, one obtained by appropriately combining a stop lamp, a tail lamp, a turn signal lamp, a back lamp, a fog lamp, and the like), and the like can be exemplified. However, the application of the vehicle luminaire 1 is not limited thereto.

(Vehicle Luminaire 1)

FIG. 1 is a schematic perspective view for illustrating the vehicle luminaire 1 according to the exemplary embodiment.

Figure 2:
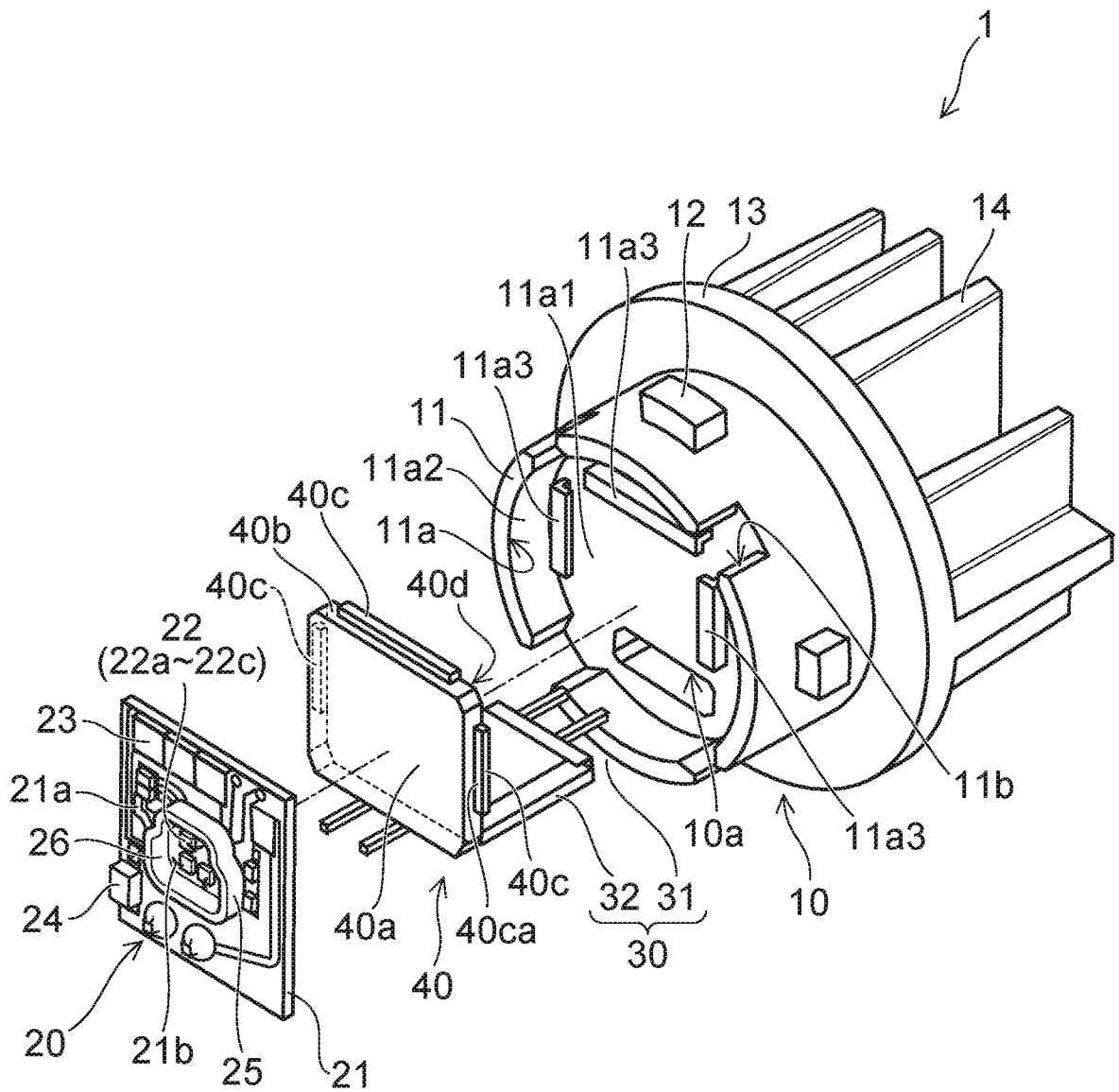
FIG. 2 is a schematic exploded view of the vehicle luminaire.

FIG. 2 is a schematic exploded view of the vehicle luminaire 1.

Figure 3:
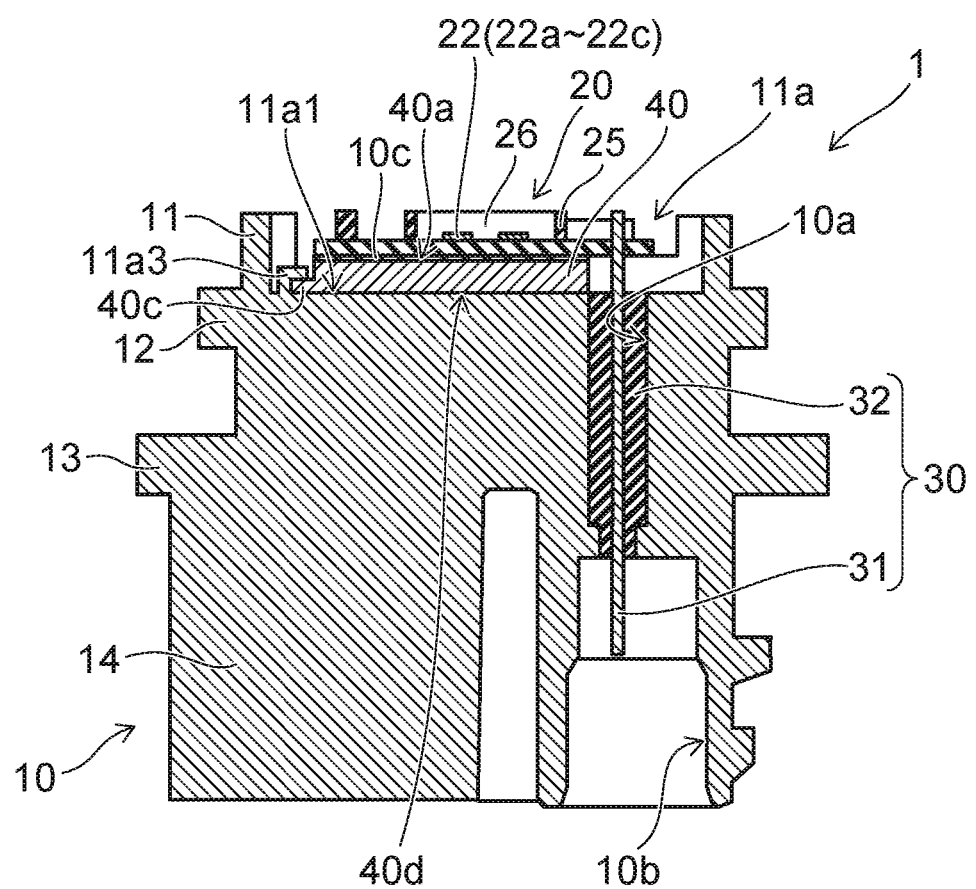
FIG. 3 is a cross-sectional view taken along line X-X in FIG. 1.

FIG. 3 is a cross-sectional view taken along line X-X of the vehicle luminaire 1 in FIG. 1.

As illustrated in FIGS. 1 to 3, the vehicle luminaire 1 includes a socket 10, a light-emitting module 20, a power-supply part 30, and a heat transfer part 40.

The socket 10 has a mounting part 11, a bayonet 12, a flange 13, and a thermal radiation fin 14.

The mounting part 11 is provided at the side of the flange 13 opposite to the side at which the thermal radiation fin 14 is provided. The outer shape of the mounting part 11 can be a column shape. The outer shape of the mounting part 11 can be, for example, a cylindrical shape. The mounting part 11 has a recessed part 11*a* opened to an end face opposite to the flange 13 side.

Further, at least one slit 11*b* is provided in the mounting part 11. The slit 11*b* penetrates between an outer side surface of the mounting part 11 and an inner side surface of the mounting part 11 (a side wall surface 11*a*2 of the recessed part 11*a*). In addition, one end of the slit 11*b* is opened to an end face of the mounting part 11 opposite to the flange 13 side. A corner part of the board 21 is provided inside the slit 11*b*. Therefore, positioning of the board 21 can be performed. Further, the planar shape of the board 21 can be increased so that the number of elements mounted on the board 21 can be increased. Alternatively, since the outside dimension of the mounting part 11 can be decreased, the mounting part 11 can be miniaturized, and further the vehicle luminaire 1 can be miniaturized.

A plurality of bayonets 12 are provided at the outer side surface of the mounting part 11. The plurality of bayonets 12 project toward the outside of the vehicle luminaire 1. The plurality of bayonets 12 face the flange 13. The plurality of bayonets 12 are used when the vehicle luminaire 1 is attached to a housing 101 of a vehicle lamp 100. The plurality of bayonets 12 are used for twist lock.

The flange 13 has a plate shape. The flange 13 can have, for example, a disk shape. The outer side surface of the flange 13 is provided at the outer side of the vehicle luminaire 1 than the outer side surface of the bayonet 12.

The thermal radiation fin 14 is provided on a surface of the flange 13 opposite to the side at which the mounting part 11 is provided. The thermal radiation fin 14 can be formed in a flat plate shape. One or more thermal radiation fins 14 may be provided. If a plurality of thermal radiation fins 14 are provided, the plurality of thermal radiation fins 14 can be provided to be parallel to each other.

Further, a hole 10a and a hole 10b connected to the hole 10a are provided in the socket 10. An insulating part 32 is provided inside the hole 10a. A connector 105 having a sealing member 105a is inserted into the hole 10b.

Heat generated in the light-emitting module 20 is mainly transferred to the thermal radiation fin 14 through the heat transfer part 40, the mounting part 11, and the flange 13. The heat transferred to the thermal radiation fin 14 is mainly discharged from the thermal radiation fin 14 to the outside. Taking into consideration that the heat generated in the light-emitting module 20 is transferred to the outside, the socket 10 is preferably formed by a material having a high rate of heat conductivity. The material having a high rate of heat conductivity can be, for example, a metal such as an aluminum alloy, a resin with high heat conductivity, or the like. The resin with high heat conductivity is, for example, a resin obtained by mixing a filler using an inorganic material with a resin such as polyethylene terephthalate (PET) or nylon. The filler using an inorganic material can be, for example, a filler using aluminum oxide, carbon, or the like. If the socket 10 is formed using a resin with high heat conductivity, the heat generated in the light-emitting module 20 can be efficiently radiated and the weight of the socket 10 can be decreased.

The light-emitting module 20 is provided at one end of the socket 10.

The light-emitting module 20 has a board 21, a light-emitting element 22, a resistor 23, a control element 24, a frame 25, and a sealing part 26.

The board 21 is provided at one end of the socket 10. The board 21 has a plate shape. The planar shape of the board 21 can be, for example, a square shape. A material or a structure of the board 21 is not particularly limited. For example, the board 21 can be formed by an inorganic material such as ceramics (for example, aluminum oxide, aluminum nitride, or the like), an organic material such as paper phenol or glass epoxy, or the like. In addition, the board 21 may employ a board obtained by coating a surface of a metal plate with an insulating material. Note that if the surface of the metal plate is coated with the insulating material, the insulating material may be formed by an organic material or an inorganic material. If the amount of heat generated in the light-emitting element 22 is large, the board 21 is preferably formed using a material having a high rate of heat conductivity from the viewpoint of thermal radiation. As a material having a high rate of heat conductivity, for example, ceramics such as aluminum oxide or aluminum nitride, a resin with high heat conductivity, a material obtained by coating a surface of a metal plate with an insulating material, and the like can be exemplified. In addition, the board 21 may be formed of a single layer or multiple layers.

Further, a wiring pattern 21a is provided on a surface of the board 21. The wiring pattern 21a can be formed, for example, by a material containing silver as a main component. The wiring pattern 21a can be formed, for example, by silver or a silver alloy. However, the material of the wiring pattern 21a is not limited to the material containing silver as a main component. The wiring pattern 21a can also be formed, for example, by a material containing copper as a main component, or the like.

Three light-emitting elements 22 (a light-emitting element 22a: corresponding to an example of a first light-emitting element, a light-emitting element 22b: corresponding to an example of a second light-emitting element, a light-emitting element 22c: corresponding to an example of a third light-emitting element) are provided on a surface, which is provided with the wiring pattern 21a, of the board 21. The light-emitting elements 22 are provided on the board 21. The light-emitting elements 22 are electrically connected to the wiring pattern 21a provided on the surface of the board 21. Light-emitting surface of the light-emitting elements 22 are directed toward a front side of the vehicle luminaire 1. The light-emitting elements 22 mainly emit light toward the front side of the vehicle luminaire 1.

The light-emitting elements 22 can be, for example, a light-emitting diode, an organic light-emitting diode, a laser diode, or the like.

The three light-emitting elements 22 are connected in series. In addition, the three light-emitting elements 22 are connected in series to the resistor 23.

Note that details of arrangement of the three light-emitting elements 22 will be described later.

The light-emitting element 22 can be, for example, a surface mount type light-emitting element, a bullet-shape light-emitting element having a lead wire, a chip-shape light-emitting element, or the like. However, taking into the consideration of miniaturization of the light-emitting module 20, the light-emitting element 22 is preferably a chip-shape light-emitting element. If the light-emitting element 22 is a chip-shape light-emitting element, the light-emitting element 22 is mounted on the board 21 by a chip on board (COB). In this manner, the three light-emitting elements 22 can be provided in a narrow region. Therefore, the light-emitting module 20 can be miniaturized, and further the vehicle luminaire 1 can be miniaturized.

Hereinafter, an example in which the light-emitting element 22 is a chip-shape light-emitting element will be described.

The light-emitting element 22 can be a top-and-bottom electrode type light-emitting element, an upper electrode type light-emitting element, a flip chip type light-emitting element, or the like. Note that the light-emitting element 22 illustrated in FIGS. 1 and 2 is a top-and-bottom electrode type light-emitting element. If the light-emitting element 22 is a top-and-bottom electrode type light-emitting element or an upper electrode type light-emitting element, the light-emitting element 22 is electrically connected to the wiring pattern 21a by a wiring 21b. If the light-emitting element 22 is a flip chip type light-emitting element, the light-emitting element 22 is connected directly to the wiring pattern 21a.

The resistor 23 is provided on a surface, which is provided with the wiring pattern 21a, of the board 21. The resistor 23 is provided on the board 21. The resistor 23 is electrically connected to the wiring pattern 21a provided on the surface of the board 21. The resistor 23 can be, for example, a resistor such as a surface mount type resistor, a resistor having a lead wire (metal oxide film resistor), or a film type resistor formed by a screen printing method or the like. Note that the resistor 23 illustrated in FIGS. 1 and 2 is a film type resistor.

A material for the film type resistor can be, for example, ruthenium oxide ($RuO_2$). The film type resistor can be formed, for example, by a screen printing method and a calcination method. If the resistor 23 is the film type resistor, it is possible to increase a contact area between the resistor 23 and the board 21. This makes it possible to improve heat-dissipation capability. In addition, a plurality of resistors 23 can be formed at once. Therefore, it is possible to improve productivity and suppress variation in resistance value in the plurality of resistors 23.

Here, since a forward voltage characteristic of the light-emitting element 22 varies, if an applied voltage between an anode terminal and a ground terminal is constant, variation occurs in brightness (luminous flux, luminance, luminous intensity, or illuminance) of light emitted from the light-emitting element 22. Therefore, a value of current flowing through the light-emitting element 22 is set within a predetermined range by the resistor 23 so that the brightness of the light emitted from the light-emitting element 22 falls within a predetermined range. In this case, the value of current flowing through the light-emitting element 22 falls within the predetermined range by changing a resistance value of the resistor 23.

If the resistor 23 is a film type resistor, when a part of the resistor 23 is removed, the resistance value can be increased. For example, a part of the resistor 23 can be easily removed by irradiating the resistor 23 with laser light. If the resistor 23 is a surface mount type resistor, a resistor having a lead wire, or the like, the resistor 23 having an appropriate resistance value is selected depending on the forward voltage characteristic of the light-emitting element 22. The number, sizes, arrangement, and the like of the resistors 23 are not limited to the example, and can be changed as appropriate depending on the specification and the like of the light-emitting elements 22.

The control element 24 is provided on the surface, which is provided with the wiring pattern 21a, of the board 21. The control element 24 is provided on the board 21. The control element 24 is electrically connected to the wiring pattern 21a provided on the surface of the board 21. The control element 24 is provided so that a reverse voltage is not applied to the light-emitting element 22 and pulse noise from a reverse direction is not applied to the light-emitting element 22. The control element 24 can be, for example, a diode. The control element 24 can be, for example, a surface mount type diode, a diode having a lead wire, or the like. The control element 24 illustrated in FIGS. 1 and 2 is a surface mount type diode.

In addition, a pull-down resistor can also be provided to detect disconnection of the light-emitting element 22 or to prevent the light-emitting element 22 from being wrongly turned on. Further, a coating part covering the wiring pattern 21a, the film type resistor, or the like can also be provided. The coating part can contain, for example, a glass material.

The frame 25 is provided on the surface, which is provided with the wiring pattern 21a, of the board 21. The frame 25 is provided on the board 21. The frame 25 is attached to the board 21. The three light-emitting elements 22 are arranged inside the frame 25. The frame 25 surrounds the three light-emitting elements 22. The frame 25 can be formed by a resin. The resin can be, for example, a thermoplastic resin such as polybutylene terephthalate (PBT), polycarbonate (PC), PET, nylon, polypropylene (PP), polyethylene (PE), or polystyrene (PS). In addition, particles of titanium oxide or the like are mixed with the resin so that the reflectance of light emitted from the light-emitting element 22 can be increased. Further, the frame 25 can also be formed, for example, by a white resin. An inner wall surface of the frame 25 can also be a slope inclined in a direction away from a center axis of the frame 25 with increasing distance from the board 21. Some of the light emitted from the light-emitting element 22 is reflected at the inner wall surface of the frame 25 and is emitted toward the front side of the vehicle luminaire 1. That is, the frame 25 can also have a function of defining a formation range of the sealing part 26 and a function of a reflector.

Note that details of the form of the frame 25 will be described later.

The sealing part 26 is provided inside the frame 25. The sealing part 26 is provided to cover the inside of the frame 25. That is, the sealing part 26 is provided inside the frame 25 and covers the light-emitting element 22, the wiring 21b, and the like. The sealing part 26 can be formed of a light-transmissive material. The sealing part 26 can be formed, for example, by filling the inside of the frame 25 with a resin. The filling with the resin can be performed, for example, using a liquid quantitative ejecting device such as a dispenser. A resin to be filled can be, for example, a silicone resin or the like.

The sealing part 26 can include a phosphor. In addition, a wavelength conversion sheet can also be provided on the light-emitting surface of the light-emitting element 22. The wavelength conversion sheet can be obtained by dispersing a granulated phosphor inside a light-transmissive resin sheet. The phosphor can be, for example, an yttrium-aluminum-garnet-based (YAG-based) phosphor. However, the type of the phosphor can be changed as appropriate so that a predetermined emission color is obtainable depending on an application or the like of the vehicle luminaire 1.

The power-supply part 30 has a power-supply terminal 31 and an insulating part 32.

The power-supply terminal 31 can be formed in a rod-shape body. The power-supply terminal 31 projects from a bottom face 11a1 of the recessed part 11a. A plurality of the power-supply terminals 31 are provided. The plurality of power-supply terminals 31 can be provided side by side in a predetermined direction. The plurality of power-supply terminals 31 are provided inside the insulating part 32. The plurality of power-supply terminals 31 extend in the inside of the insulating part 32 and project from an end face of the insulating part 32 at the light-emitting module 20 side and an end face of the insulating part 32 at the thermal radiation fin 14 side. Ends of the plurality of power-supply terminals 31 at the light-emitting module 20 side are soldered with the wiring pattern 21a. The ends of the plurality of power-supply terminals 31 at the thermal radiation fin 14 side are exposed to the inside of the hole 10b. The connector 105 is fitted to the plurality of power-supply terminals 31 exposed to the inside of the hole 10b. The power-supply terminal 31 has electrical conductivity. The power-supply terminal 31 can be formed, for example, by a metal such as a copper alloy. Note that the numbers, shapes, arrangement, materials, and the like of the power-supply terminals 31 are not limited to the examples, and can be changed as appropriate.

As described above, the socket 10 is preferably formed by a material having a high rate of heat conductivity. However, the material having a high rate of heat conductivity has electrical conductivity in some cases. For example, a resin with high heat conductivity containing a filler formed by carbon, or the like has electrical conductivity. For this reason, the insulating part 32 is provided to insulate between the power-supply terminal 31 and the socket 10 having electrical conductivity. In addition, the insulating part 32 also has a function of holding the plurality of power-supply terminals 31. Note that if the socket 10 is formed by an insulating resin with high heat conductivity (for example, a resin with high heat conductivity containing a filler formed by ceramics, or the like), the insulating part 32 may not be provided. In this case, the socket 10 holds the plurality of power-supply terminals 31.

The insulating part 32 is provided between the power-supply terminal 31 and the socket 10. The insulating part 32 has insulation property. The insulating part 32 can be formed by a resin with insulation property. The insulating part 32 can be formed, for example, by PET, nylon, or the like. The insulating part 32 is provided inside the hole 10a provided in the socket 10.

The heat transfer part 40 has a plate shape. The planar shape of the heat transfer part 40 can be, for example, a square shape. A joining part 40c can be provided at the side part 40b of the heat transfer part 40. The joining part 40c projects from the side part 40b of the heat transfer part 40 to the outside. The heat transfer part 40 is provided with four side parts 40b, but the joining part 40c may be provided with at least two of the four side parts 40b. For example, as illustrated in FIG. 2, the joining part 40c can be provided at each of three side parts 40b of the heat transfer part 40. A surface 40ca of the joining part 40c at the board 21 side is provided at the flange 13 side in relation to the surface 40a of the heat transfer part 40 at the board 21 side. A holding part 11a 3 projecting from the bottom face 11a1 of the recessed part 11a is in contact with the surface 40ca of the joining part 40c. For example, the inverted L-shape holding part 11a3 is formed by melting an apex of a convex part projecting from the bottom face 11a1 of the recessed part 11a with ultrasonic wave so that the holding part 11a3 and the surface 40ca of the joining part 40c can be brought into contact with each other. The heat transfer part 40 is preferably formed by a material having a high rate of heat conductivity. The heat transfer part 40 can be formed, for example, by a metal such as aluminum, an aluminum alloy, copper, or a copper alloy. The joining part 40c can be formed, for example, using a press molding method.

An attachment part 10c is provided between the surface 40a of the heat transfer part 40 and the board 21. That is, the board 21 is attached to the surface 40a of the heat transfer part 40. The attachment part 10c can be an attachment part formed by curing an adhesive. The type of the adhesive is not particularly limited, and an adhesive having a high rate of heat conductivity is preferably used. For example, the adhesive can be an adhesive mixed with a filler using an inorganic material. The inorganic material is preferably a material having a high rate of heat conductivity (for example, ceramics such as aluminum oxide or aluminum nitride). A rate of heat conductivity of the adhesive can be set to, for example, 0.5 W/(m·K) or more and 10 W/(m·K) or less.

A layer formed by heat conductive grease (thermal radiation grease) or a layer formed by the aforementioned adhesive (the attachment part 10c) can be provided between a surface 40d of the heat transfer part 40 and the bottom face 11a1 of the recessed part 11a. The type of heat conductive grease is not particularly limited, and for example, heat conductive grease obtained by mixing a filler using an inorganic material with modified silicone can be used. The inorganic material is preferably a material having a high rate of heat conductivity (for example, ceramics such as aluminum oxide or aluminum nitride). A rate of heat conductivity of the heat conductive grease can be set to, for example, 1 W/(m·K) or more and 5 W/(m·K) or less. Note that, if the attachment part 10c is provided between the surface 40d of the heat transfer part 40 and the bottom face 11a1 of the recessed part 11a, the joining part 40c and the holding part 11a3 may not be provided. In addition, the heat transfer part 40 is not necessarily needed and can be provided as necessary.

Next, the arrangement of the three light-emitting elements 22 and the form of the frame 25 will be described in more detail.

Figures 4A, 4B:
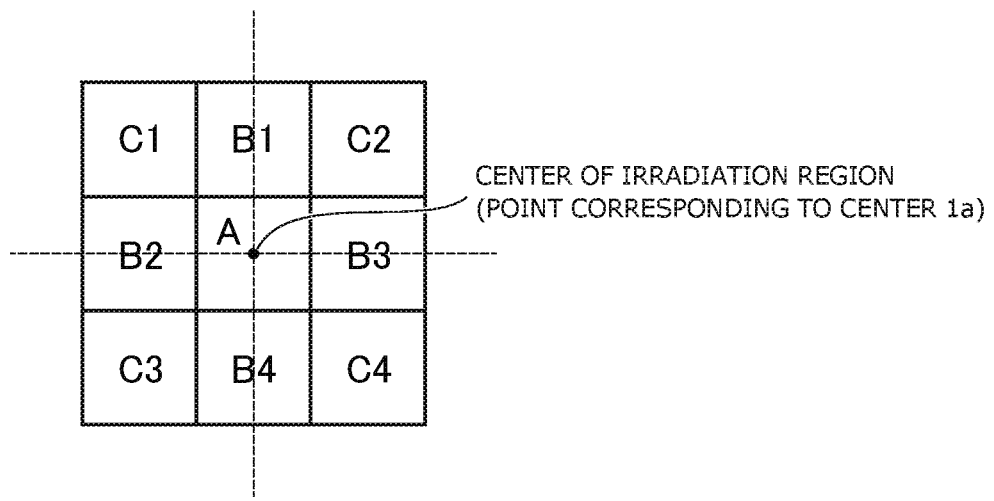
FIG. 4A is a view for illustrating an irradiation region divided into nine regions and FIG. 4B is a table for illustrating a proportion of a luminous flux emitted in a visual direction.

FIGS. 4A and 4B are views for illustrating light distribution characteristics.

FIG. 4A is a view for illustrating an irradiation region divided into nine regions.

FIG. 4B is a table for illustrating a proportion of a luminous flux emitted in a visual direction.

Here, the proportion of a luminous flux emitted in the visual direction in each irradiation region in the table is a relative value when the total value of luminous fluxes emitted in the visual direction from the light-emitting module 20 is regarded as 100%.

For example, in the case of a vehicle luminaire provided in a front combination light or the like of an automobile, it is preferable to set a light distribution characteristic that is almost a point of symmetry with respect to a point (a center of the irradiation region) corresponding to a center is of the vehicle luminaire 1 as illustrated in FIGS. 4A and 4B.

In this case, if one light-emitting element 22 is provided at each of four corners of a quadrate or each of four ends of a cross with the center 1a of the vehicle luminaire 1 as a centroid, a light distribution characteristic that is almost a point of symmetry with respect to the center of the irradiation region is easily obtainable.

However, in this case, spaces for providing four light-emitting elements 22 are necessary, and thus the light-emitting module 20 is difficult to miniaturize.

Further, in the case of the vehicle luminaire 1 provided in an automobile, there is a limit to a voltage applied to the light-emitting module 20. For example, the voltage applied to the light-emitting module 20 is about 13.5 V. In this case, the resistor 23 and the control element 24 are electrically connected to the plurality of light-emitting elements 22. Therefore, voltages applied to the plurality of light-emitting elements 22 are about 10 V to 12 V. Here, if the number of the light-emitting elements 22 connected in series increases, a desired total luminous flux may not be obtainable depending on a forward voltage characteristic of the light-emitting element 22. For example, if the light-emitting elements 22 are blue light-emitting diodes, a voltage drop per one light-emitting diode is about 3 V. Therefore, if four blue light-emitting diodes are connected in series, the voltage drop is about 12 V, and thus a desired total luminous flux is not obtainable.

In this case, if the number of the light-emitting elements 22 is set to three, an installation space can be reduced. In addition, since the voltage drop is about 9 V even if three blue light-emitting diodes are connected in series, a desired total luminous flux is easy to obtain.

In this regard, in the vehicle luminaire 1 according to the exemplary embodiment, three light-emitting elements 22 are provided in the light-emitting module 20.

Figure 5:
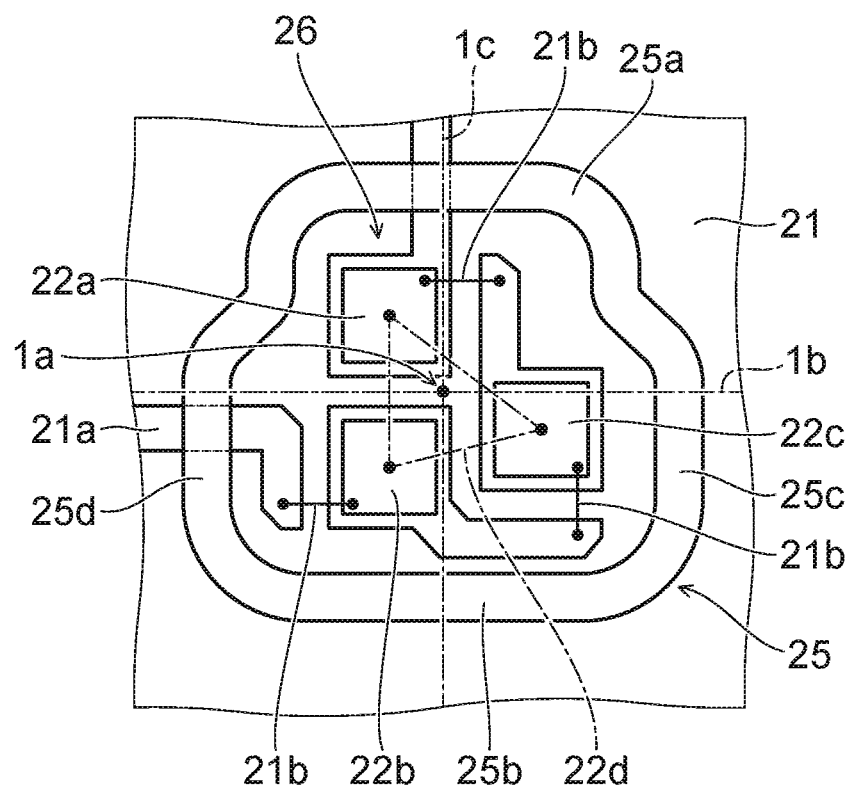
FIG. 5 is a schematic plan view for illustrating arrangement of light-emitting elements and the form of a frame.

FIG. 5 is a schematic plan view for illustrating arrangement of the light-emitting elements 22a to 22c and the form of the frame 25.

FIG. 5 illustrates an example of a region in which the light-emitting elements 22a to 22c are provided in planar view (when the region is viewed from the light-emitting side).

As illustrated in FIG. 5, the light-emitting elements 22a to 22c are provided near the center 1a of the vehicle luminaire 1.

The center 1a of the vehicle luminaire 1 is included in the inside of a triangle 22d formed from line segments connecting respective centers of the light-emitting elements 22a to 22c.

The triangle 22d is preferably a scalene triangle. If the triangle 22d is a scalene triangle, as compared to the case of the triangle 22d being an equilateral triangle or an isosceles triangle, a light distribution characteristic that is almost a point of symmetry with respect to the center of the irradiation region is easily obtainable.

Further, if at least any one of the following conditions is satisfied, a light distribution characteristic that is almost a point of symmetry is further easily obtainable.

For example, a position of a center of the light-emitting element 22a and a position of a center of the light-emitting element 22b are preferably linearly symmetrical with respect to a line segment 1b (corresponding to an example of the first line segment) passing through the center 1a as a symmetrical axis.

For example, a shape of the light-emitting element 22a and a shape of the light-emitting element 22b are preferably linearly symmetrical with respect to the line segment 1b passing through the center 1a as a symmetrical axis.

For example, a center of the light-emitting element 22c can be provided at a side opposite to the center of the light-emitting element 22a and the center of the light-emitting element 22b with a line segment 1c (corresponding to an example of the second line segment), which passes through the center 1a and is orthogonal to the line segment 1b, interposed therebetween.

For example, the center of the light-emitting element 22b and the center of the light-emitting element 22c can be provided at a side opposite to the center of the light-emitting element 22a with the line segment 1b interposed therebetween.

For example, a shortest distance between the center of the light-emitting element 22c and the line segment 1c can be longer than at least any one of a shortest distance between the center of the light-emitting element 22a and the line segment 1c and a shortest distance between the center of the light-emitting element 22b and the line segment 1c.

For example, a shortest distance between the center of the light-emitting element 22b and the line segment 1b can be the same as a shortest distance between the center of the light-emitting element 22a and the line segment 1b.

For example, planar shapes of the light-emitting elements 22a to 22c can be a square shape.

For example, a side of the light-emitting element 22a at the line segment 1b side can be parallel to the line segment 1b, and a side of the light-emitting element 22a at the line segment 1c side can be parallel to the line segment 1c.

For example, a side of the light-emitting element 22b at the line segment 1b side can be parallel to the line segment 1b, and a side of the light-emitting element 22b at the line segment is side can be parallel to the line segment 1c.

For example, a side of the light-emitting element 22c at the line segment 1b side can be parallel to the line segment 1b, and a side of the light-emitting element 22c at the line segment 1c side can be parallel to the line segment 1c.

Further, as illustrated in FIG. 5, the shape of the frame 25 in planar view can be a shape which is linearly symmetrical with respect to the line segment 1c as a symmetrical axis.

The frame 25 has a side wall 25a (corresponding to an example of the first side wall), a side wall 25b (corresponding to an example of the second side wall), a side wall 25c (corresponding to an example of the third side wall), and a side wall 25d (corresponding to an example of the fourth side wall).

The side wall 25b faces the side wall 25a. One end of the side wall 25c is connected to one end of the side wall 25a. Another end of the side wall 25c is connected to one end of the side wall 25b. One end of the side wall 25d is connected to another end of the side wall 25a. Another end of the side wall 25d is connected to another end of the side wall 25b.

The side wall 25a of the frame 25 can be provided at the side opposite to the light-emitting element 22b with the light-emitting element 22a interposed therebetween.

The side wall 25b can be provided at the side opposite to the light-emitting element 22a with the light-emitting element 22b interposed therebetween.

In planar view, the side wall 25a and the side wall 25b can have parts parallel to the line segment 1b.

In planar view, the side wall 25c and the side wall 25d can have parts parallel to the line segment 1c.

In planar view, the side wall 25b can be set to be longer than the side wall 25a.

In planar view, the side wall 25c can be provided at the side opposite to the light-emitting element 22b with the light-emitting element 22c interposed therebetween.

In planar view, the side wall 25d can be provided at the side opposite to the light-emitting element 22c with the light-emitting element 22b interposed therebetween.

In planar view, the side wall 25c and the side wall 25d can have the same length.

In planar view, a vicinity of an end of the side wall 25c at the side wall 25a side can be curved to the inside of the frame 25.

A vicinity of an end of the side wall 25d at the side wall 25a side can be curved to the inside of the frame 25.

Planar shapes of the resistor 23 and the control element 24 mentioned above are a square shape in many cases. Therefore, if the planar shape of the frame 25 is as described above, the resistor 23 and the control element 24 can be provided along the side wall of the frame 25. As a result, spaces to be wasted can be reduced as compared to the case of a frame having an annular planar shape, and thus miniaturization of the light-emitting module 20 becomes easier.

(Vehicle Lamp)

Next, the vehicle lamp 100 will be illustrated.

Note that, in the following description, for example, description will be given using an example in which the vehicle lamp 100 is a front combination light provided in an automobile. However, the vehicle lamp 100 is not limited to the front combination light provided in the automobile. The vehicle lamp 100 may be a vehicle lamp provided in an automobile, a rail vehicle, or the like.

Figure 6:
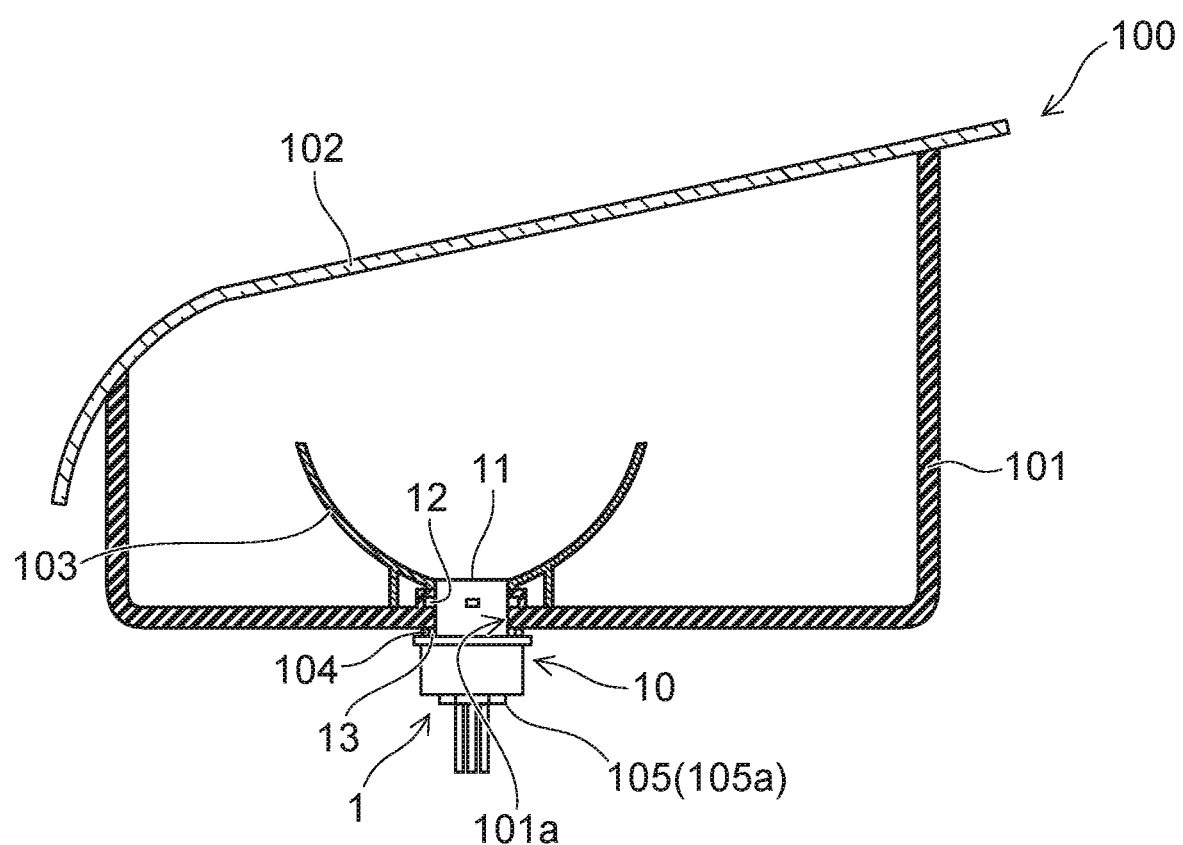
FIG. 6 is a schematic partial cross-sectional view for illustrating a vehicle lamp.

FIG. 6 is a schematic partial cross-sectional view for illustrating the vehicle lamp 100.

As illustrated in FIG. 6, the vehicle lamp 100 includes the vehicle luminaire 1, the housing 101, a cover 102, an optical element part 103, a sealing member 104, and the connector 105.

The housing 101 holds the mounting part 11. The housing 101 has a box shape in which one end side is opened. The housing 101 can be formed, for example, by a resin which does not transmit light, or the like. An attachment hole 101a is provided at the bottom face of the housing 101. A part of the mounting part 11 on which the bayonet 12 is provided is inserted into the attachment hole 101a. A recessed part is provided at a circumferential edge of the attachment hole 101a. The bayonet 12 provided at the mounting part 11 is inserted into the recessed part. Note that, although the example in which the attachment hole 101a is provided directly in the housing 101 is described, an attachment member having the attachment hole 101a may be provided in the housing 101.

When the vehicle luminaire 1 is attached to the vehicle lamp 100, the part of the mounting part 11 on which the bayonet 12 is provided is inserted into the attachment hole 101a and the vehicle luminaire 1 is rotated. In this way, the bayonet 12 is held at a fitting part provided at the circumferential edge of the attachment hole 101a. Such an attachment method is called twist lock.

The cover 102 is provided to cover the opening of the housing 101. The cover 102 can be formed by a light-transmissive resin, or the like. The cover 102 can also have a function of a lens or the like.

Light emitted from the vehicle luminaire 1 enters the optical element part 103. The optical element part 103, for example, reflects, diffuses, guides, and condenses the light emitted from the vehicle luminaire 1, and forms a predetermined light distribution pattern. For example, the optical element part 103 illustrated in FIG. 6 is a reflector. In this case, the optical element part 103 reflects the light emitted from the vehicle luminaire 1 to form a predetermined light distribution pattern.

The sealing member 104 is provided between the flange 13 and the housing 101. The sealing member 104 can be formed in an annular shape. The sealing member 104 can be formed by a material with elasticity such as rubber or a silicone resin.

When the vehicle luminaire 1 is attached to the vehicle lamp 100, the sealing member 104 is sandwiched between the flange 13 and the housing 101. Therefore, an internal space of the housing 101 is sealed by the sealing member 104. In addition, the bayonet 12 is pressed against the housing 101 by elastomeric force of the sealing member 104. Therefore, detachment of the vehicle luminaire 1 from the housing 101 can be suppressed.

The connector 105 is fitted to ends of the plurality of power-supply terminals 31 exposed to the inside of the hole 10b. A power-supply or the like (not illustrated) is electrically connected to the connector 105. Therefore, by fitting the connector 105 to the ends of the power-supply terminals 31, the power-supply or the like (not illustrated) is electrically connected to the light-emitting element 22. Further, the connector 105 has a step portion. Then, the sealing member 105a is attached to the step portion. The sealing member 105a is provided to prevent water from infiltrating to the inside of the hole 10b. When the connector 105 having the sealing member 105a is inserted into the hole 10b, the hole 10b is watertightly sealed. The sealing member 105a can be formed in an annular shape. The sealing member 105a can be formed by a material with elasticity such as rubber or a silicone resin. The connector 105 can also be bonded to an element at the socket 10 side, for example, using an adhesive or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A vehicle luminaire comprising:
   a socket;
   a board provided at one end of the socket;
   only three light-emitting elements provided on the board; and
   a frame provided on the board and surrounding the three light-emitting elements,
   a triangle formed by line segments connecting respective centers of the three light-emitting elements being a scalene triangle in planar view,
   a center of the vehicle luminaire being included inside the scalene triangle,
   wherein a second line segment passing through the center of the vehicle luminaire is orthogonal to a first line segment passing through the center of the vehicle luminaire in planar view,
   a shape of the frame in planar view is a shape which is linearly symmetrical with respect to the second line segment as a symmetrical axis, and
   wherein the frame comprises:
      a first side wall;
      a second side wall facing the first side wall;
      a third side wall having one end connected to one end of the first side wall and another end connected to one end of the second side wall; and
      a fourth side wall having one end connected to another end of the first side wall and another end connected to another end of the second side wall,
      the first side wall and the second side wall comprise parts parallel to the first line segment in planar view, and
      the third side wall and the fourth side wall comprise parts parallel to the second line segment.

2. The luminaire according to claim 1, wherein the three light-emitting elements are a first light-emitting element, a second light-emitting element, and a third light-emitting element, and
   a position of a center of the first light-emitting element and a position of a center of the second light-emitting element are linearly symmetrical with respect to the first line segment passing through the center of the vehicle luminaire as a symmetrical axis in planar view.

3. The luminaire according to claim 1, wherein the three light-emitting elements are a first light-emitting element, a second light-emitting element, and a third light-emitting element,
   a shape of the first light-emitting element and a shape of the second light-emitting element are linearly symmetrical with respect to the first line segment passing through the center of the vehicle luminaire as a symmetrical axis in planar view.

4. The luminaire according to claim 1, wherein the three light-emitting elements are a first light-emitting element, a second light-emitting element, and a third light-emitting element, the second line segment passing through the center of the vehicle luminaire is orthogonal to the first line segment passing through the center of the vehicle luminaire in planar view, and a center of the third light-emitting element is provided at a side opposite to a center of the first light-emitting element and a center of the second light-emitting element with the second line segment interposed therebetween.

5. The luminaire according to claim 1, wherein the three light-emitting elements are a first light-emitting element, a second light-emitting element, and a third light-emitting element, and a center of the second light-emitting element and a center of the third light-emitting element are provided at a side opposite to a center of the first light-emitting element with the first line segment passing through the center of the vehicle luminaire interposed therebetween.

6. The luminaire according to claim 1, wherein the three light-emitting elements are a first light-emitting element, a second light-emitting element, and a third light-emitting element, the second line segment passing through the center of the vehicle luminaire is orthogonal to the first line segment passing through the center of the vehicle luminaire in planar view, and a shortest distance between a center of the third light-emitting element and the second line segment is longer than at least any one of a shortest distance between a center of the first light-emitting element and the second line segment and a shortest distance between a center of the second light-emitting element and the second line segment.

7. The luminaire according to claim 1, wherein the three light-emitting elements are a first light-emitting element, a second light-emitting element, and a third light-emitting element, and a shortest distance between a center of the second light-emitting element and the first line segment passing through the center of the vehicle luminaire is the same as a shortest distance between a center of the first light-emitting element and the first line segment.

8. The luminaire according to claim 1, wherein planar shapes of the three light-emitting elements are a square shape.

9. The luminaire according to claim 8, wherein the three light-emitting elements are a first light-emitting element, a second light-emitting element, and a third light-emitting element, the second line segment passing through the center of the vehicle luminaire is orthogonal to the first line segment passing through the center of the vehicle luminaire in planar view, and a side of the first light-emitting element at the first line segment side is parallel to the first line segment and a side of the first light-emitting element at the second line segment side is parallel to the second line segment.

10. The luminaire according to claim 8, wherein the three light-emitting elements are a first light-emitting element, a second light-emitting element, and a third light-emitting element, the second line segment passing through the center of the vehicle luminaire is orthogonal to the first line segment passing through the center of the vehicle luminaire in planar view, and a side of the second light-emitting element at the first line segment side is parallel to the first line segment and a side of the second light-emitting element at the second line segment side is parallel to the second line segment.

11. The luminaire according to claim 8, wherein the three light-emitting elements are a first light-emitting element, a second light-emitting element, and a third light-emitting element, the second line segment passing through the center of the vehicle luminaire is orthogonal to the first line segment passing through the center of the vehicle luminaire in planar view, and a side of the third light-emitting element at the first line segment side is parallel to the first line segment and a side of the third light-emitting element at the second line segment side is parallel to the second line segment.

12. The luminaire according to claim 1, wherein the three light-emitting elements are connected in series.

13. The luminaire according to claim 1, wherein the three light-emitting elements are provided near the center of the vehicle luminaire.

14. The luminaire according to claim 1, wherein the second side wall is longer than the first side wall in planar view, a vicinity of an end of the third side wall at the first side wall side is curved to the inside of the frame, and a vicinity of an end of the fourth side wall at the first side wall side is curved to the inside of the frame.

15. The luminaire according to claim 1, wherein the frame contains a thermoplastic resin.

16. The luminaire according to claim 1, further comprising a sealing part provided inside the frame and covering the three light-emitting elements.

17. The luminaire according to claim 1, wherein the socket contains a resin with high heat conductivity.

18. A vehicle lamp comprising:
the vehicle luminaire according to claim 1; and
a housing to which the vehicle luminaire is attached.

* * * * *